(12) United States Patent
Fung

(10) Patent No.: US 7,804,130 B1
(45) Date of Patent: Sep. 28, 2010

(54) SELF-ALIGNED V-CHANNEL MOSFET

(75) Inventor: Ka-Hing Fung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/198,507

(22) Filed: Aug. 26, 2008

(51) Int. Cl.
 *H01L 29/04* (2006.01)
(52) U.S. Cl. ............... 257/330; 257/410; 257/E29.004; 257/E29.052; 257/E29.26; 257/E21.428; 438/187; 438/589; 438/591
(58) Field of Classification Search ................. 257/324, 257/330, 411, E29.004, E29.165; 438/216, 438/261, 287, 589, 591
See application file for complete search history.

(56) References Cited

U.S. PATENT DOCUMENTS

| | | | |
|---|---|---|---|
| 6,150,693 A * | 11/2000 | Wollesen | 257/330 |
| 6,169,003 B1 | 1/2001 | Hu et al. | |
| 6,225,173 B1 | 5/2001 | Yu | |
| 6,551,886 B1 | 4/2003 | Yu | |
| 7,141,851 B2 | 11/2006 | Jang et al. | |
| 7,381,608 B2 | 6/2008 | Brask et al. | |
| 7,528,027 B1 * | 5/2009 | Zhu et al. | 438/197 |
| 2006/0102968 A1 * | 5/2006 | Bojarczuk et al. | 257/392 |

OTHER PUBLICATIONS

Jeongho Lyu, et al., "A Novel 0.1 μm MOSFET Structure with Inverted Sidewall and Recessed Channel," IEEE Electron Device Letters, vol. 17, No. 4, Apr. 1996, pp. 157-159.
B. Majumdar, et al., A New Grooved Gate Lateral Power MOSFET Structure for Synchronous Rectification in dc/dc Converters, 0-7803-4879-6/98, IEEE 1998, pp. 318-323.
Jong-Ho Lee et al., "Partially Depleted SOI NMOSFET's with Self-Aligned Polysilicon Gate Formed on the Recessed Channel Region," IEEE Electron Device Letters, vol. 18, No. 5, May 1997, pp. 184-186.

* cited by examiner

*Primary Examiner*—Mary Wilczewski
*Assistant Examiner*—Toniae M Thomas
(74) *Attorney, Agent, or Firm*—Duane Morris LLP

(57) ABSTRACT

Forming a high-κ/metal gate field effect transistor using a gate last process in which the channel region has a curved profile thus increasing the effective channel length improves the short channel effect. During the high-κ/metal gate process, after the sacrificial materials between the sidewall spacers are removed, the exposed semiconductor substrate surface at the bottom of the gate trench cavity is etched to form a curved recess. Subsequent deposition of high-κ gate dielectric layer and gate electrode metal into the gate trench cavity completes the high-κ/metal gate field effect transistor having a curved channel region that has a longer effective channel length.

18 Claims, 11 Drawing Sheets

SELF-ALIGNED V-CHANNEL MOSFET

CROSS-REFERENCE TO RELATED APPLICATIONS

None

FIELD OF THE INVENTION

The present invention relates generally to a method of fabricating CMOS transistors.

BACKGROUND

Current silicon based MOSFET technologies have limited capability to go sub-45 nm critical feature size. Vt mismatch and short channel effect problems are some of the road blocks. Some possible solutions are transitioning to 2-D or even 3-D transistor structures but 2-D/3-D transistor structures require increased process and modeling complexity.

SUMMARY

According to an implementation of the present disclosure a method for manufacturing an integrated circuit comprises forming a field effect transistor gate structure between a source region and a drain region in a semiconductor substrate, wherein the gate structure includes a sacrificial material between a pair of sidewall spacers. An insulation layer is formed over the gate structure and polished until the sacrificial material is exposed. The sacrificial material is then removed, thereby forming a cavity between the sidewall spacers and exposing the semiconductor substrate between the sidewall spacers. A curved recess is formed in exposed semiconductor substrate within the cavity, whereby the recess forms an a self-aligned curved channel region. A gate dielectric layer is formed overlying the curved channel region and a metal gate electrode is formed overlying the gate dielectric layer. The gate dielectric layer may be formed of a high-κ dielectric material.

According to another aspect of the present disclosure, a metal oxide semiconductor field effect transistor device is disclosed. The transistor device comprises a semiconductor substrate and a source region and a drain region formed in the semiconductor substrate. A recessed channel region in the semiconductor substrate between the source region and the drain region is formed by a pair of inclined surfaces in the semiconductor substrate wherein the inclined surfaces are oriented along <111> crystal directions. A high-κ gate dielectric layer overlies the recessed channel region and a metal gate electrode overlies the gate dielectric layer.

The metal oxide semiconductor field effect transistor device of the present disclosure may be formed on a bulk polysilicon or silicon on insulator (SOI) substrates. The curved channel region of the field effect transistor of the present disclosure has longer effective channel length and thus result in a transistor with better short channel effect and improved transistor performance.

BRIEF DESCRIPTION OF THE DRAWINGS

The features shown in the above referenced drawings are illustrated schematically and are not intended to be drawn to scale nor are they intended to be shown in precise positional relationship. Like reference numbers indicate like elements

DETAILED DESCRIPTION

Figure 1:
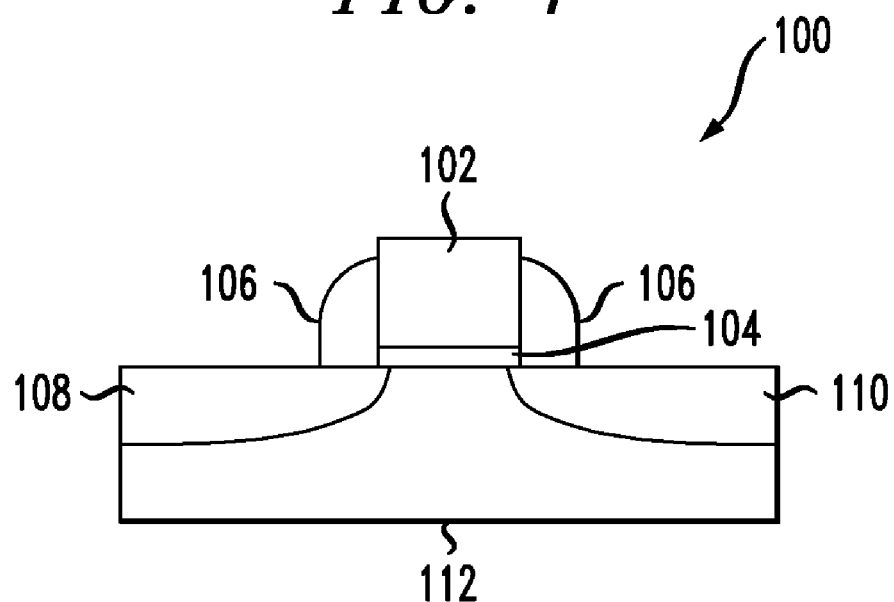
FIGS. 1 through 8 illustrate various stages of the structure of a field effect transistor that may be formed when forming the transistor according to an implementation of the method of the present disclosure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

According to an implementation of the present disclosure, a method for manufacturing an integrated circuit comprising forming a field effect transistor having improved short channel effect is disclosed. FIG. 1 illustrates a field effect transistor 100 that is formed on a semiconductor substrate 112 such as a semiconductor wafer. The transistor 100 comprises a source region 108 and a drain region 110 formed in the semiconductor substrate 112 and gate structures formed between the source region 108 and the drain region 110. The gate structures include a gate oxide 104 and a gate electrode 102 disposed between spacers 106. The gate oxide 104 may be formed from silicon dioxide that is thermally grown. The gate electrode 102 may be formed by depositing and patterning a layer of polysilicon. Conventional photolithography techniques may be used to pattern the polysilicon to form the gate electrode 102. The method according to the present disclosure is a gate last process and thus the gate electrode 102 and the gate oxide 104 formed at this stage of the process are sacrificial or dummy gate material that will be later removed.

The source region 108 and the drain region 110 may be formed by implanting dopants into the regions of the surface of the substrate 112 that are adjacent to the spacers 106. Dopants that may be used to form the source region 108 and the drain region 110 are well known in the art. A high temperature annealing process may be used to activate the dopants to complete formation of the source and drain regions 108 and 110.

The semiconductor substrate 112 may further include isolation structures (not shown). Such isolation structures may include, but are not limited to, inter-layer dielectrics (ILD) such as carbon doped oxide (CDO) or silicon dioxide ($SiO_2$), shallow trench isolation (STI) structures, or other materials that may separate the active regions of adjacent transistors. Methods for forming the isolation structures are well known in the art.

Figure 2:
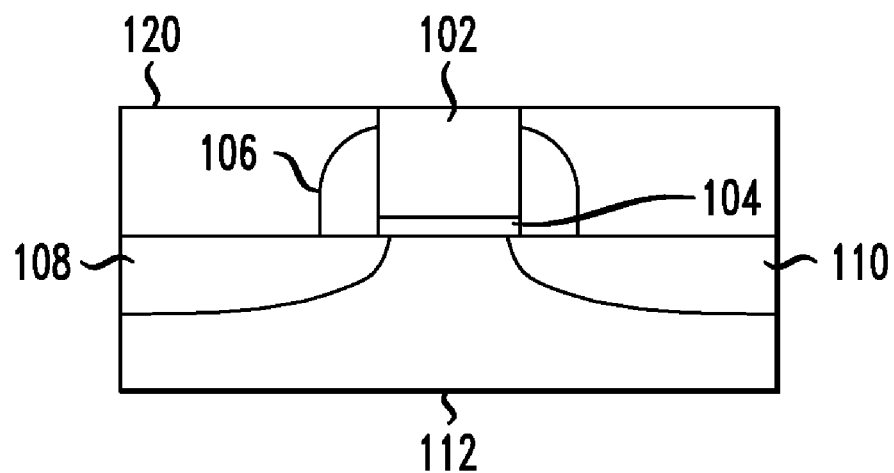

Referring to FIG. 2, a first ILD layer 120 may be deposited over the transistor 100. The first ILD layer 120 may be formed using any of a variety of conventional dielectric materials used informing interlayer dielectrics. Such dielectric materials include, but are not limited to, oxides such as silicon dioxide and carbon doped oxide, silicon nitride, organic polymers such as perfluorocyclobutane, or fluorosilicate glass. The first ILD layer 120 may be deposited using vapor deposition processes such as chemical vapor deposition (CVD), plasma enhanced chemical vapor deposition (PECVD), physical vapor deposition (PVD), or atomic layer deposition (ALD). Alternatively, the first ILD layer 120 may be formed using epitaxial processes.

As shown in FIG. 2, the first ILD layer 120 may be polished back or planarized until a top surface of the sacrificial gate electrode 102 is exposed. A chemical-mechanical polishing (CMP) process may be used to planarize the first ILD layer 120 and expose the sacrificial gate electrode 102. In some implementations, the CMP process may over-polish the first ILD layer 120 to ensure that the sacrificial gate electrode 102 is exposed.

Figure 3:
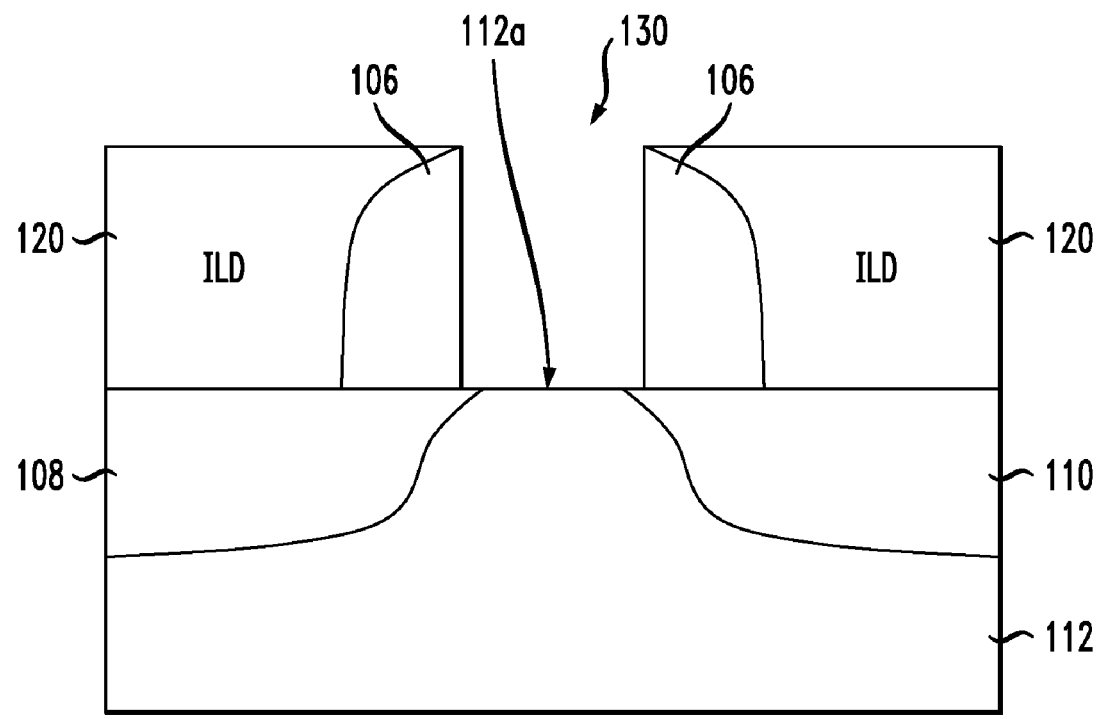

Referring to FIG. 3, next, the sacrificial gate electrode 102 and the sacrificial gate oxide 104 may be removed leaving a gate trench or a cavity 130 between the spacers 106 and exposing a portion 112a of the semiconductor substrate at the bottom of the cavity 130. A wet or a dry etch process may be used to remove the sacrificial gate electrode 102 and gate oxide 104. A wet etch process may expose the sacrificial gate materials to an aqueous solution consisting of a source of hydroxide. The wet etch may be applied for a sufficient length of time and at a sufficient temperature to remove substantially all of the sacrificial gate electrode 102 and the gate oxide 104. For example, in one implementation, the source of hydroxide may contain between about 1 and about 40 percent ammonium hydroxide or a tetraalkyl ammonium hydroxide, e.g., tetramethyl ammonium hydroxide, by volume in deionized water. As will be recognized by those skilled in the art, the exact constituents of the etching solution may vary from those presented herein.

In alternate implementation, a dry etch process may be used to selectively remove the sacrificial gate electrode 102 and gate oxide 104. The dry etch process may comprise exposing the sacrificial gate materials to a plasma derived from materials that include, but are not limited to, sulfur hexafluoride, hydrogen bromide, hydrogen iodide, chlorine, argon, and/or helium. Such selective dry etch process may take place in a parallel plate reactor or in an electron cyclotron resonance etcher. In some implementations, a hydrogen fluoride etchant or a conventional wet etchant may be used to remove the sacrificial gate oxide 104.

Figure 4:
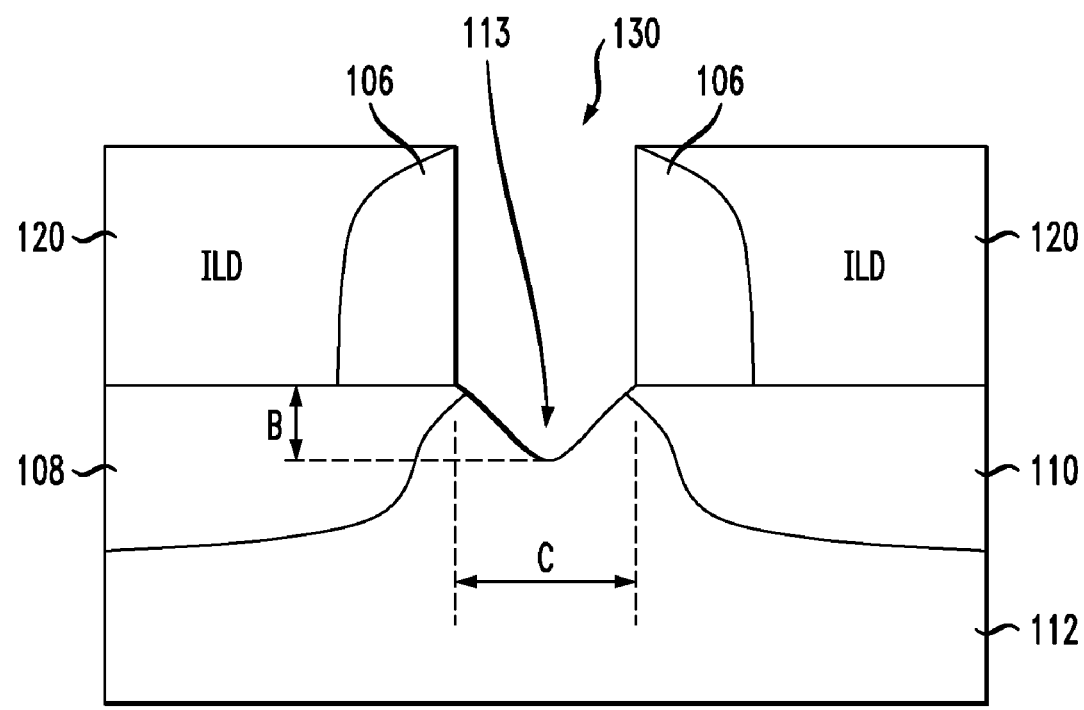

Referring to FIG. 4, after the sacrificial gate electrode 102 and the gate oxide 104 are removed, the exposed semiconductor substrate surface 112a is etched to form a recessed surface 113. This recessed surface 113 forms a self-aligned curved channel region for the transistor 100 that has increased effective channel length achieved by the recessed surface 113 of the curved channel region.

Figure 9:
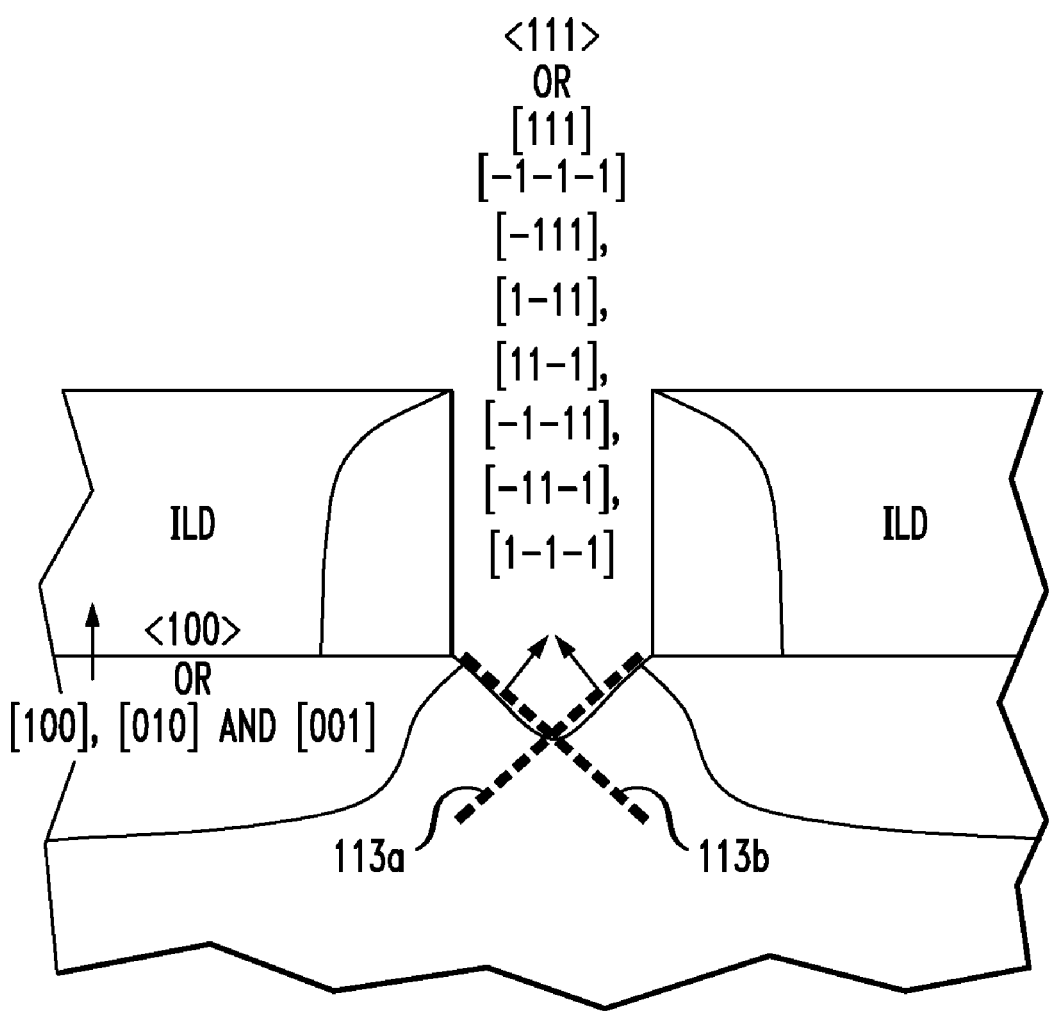
FIG. 9 is a detailed illustration of an embodiment of the curved channel region of a field effect transistor being formed according to an implementation of the method of the present disclosure.
Figure 10A:
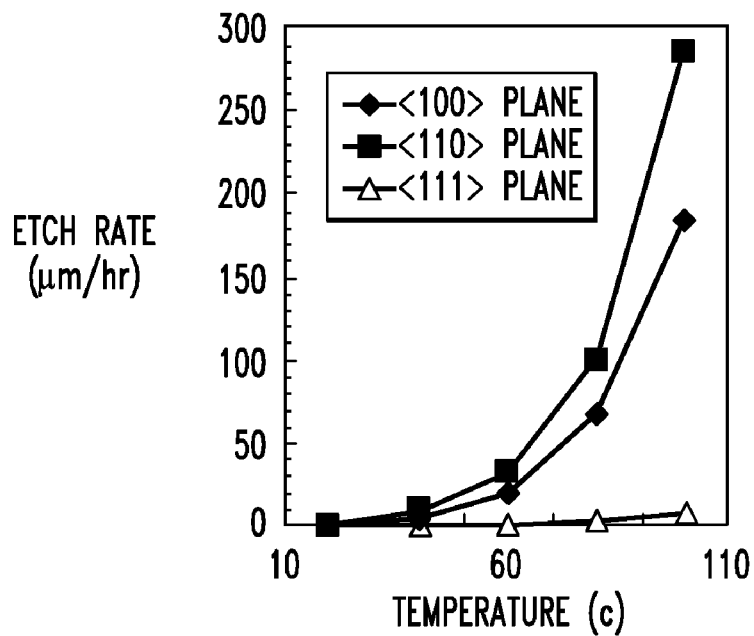
FIGS. 10a and 10b are graphs illustrating the preferential etching property of KOH with respect to different crystallographic planes in silicon.
Figure 10B:
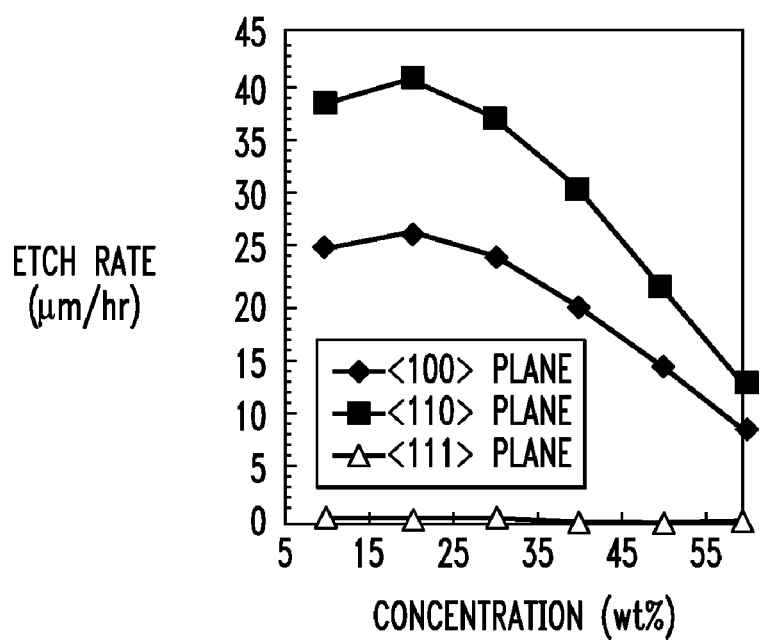

According to one implementation, the recessed surface 113 may be formed by wet etching the semiconductor substrate surface 112a using a KOH based etchant. The etchant may be a mixed solution of KOH or a mixed vapor of KOH. For silicon semiconductor substrate 112, KOH etchant etches silicon with high selectivity over nitride and oxide. Also KOH at certain temperature and concentration gives much higher etch rate of silicon in <100>/<110> crystallographic direction than in <111> direction. Thus, when the semiconductor substrate surface 112a, a <100> surface, is etched the etching process is self-limiting at <111> direction and result in a V-shaped recessed surface 113 as shown in FIG. 9. The inclined surfaces 113a and 113b forming the V-shaped recess are (111), (-1-1-1), (1-11), (11-1), (-111), (-1-11), (-11-1), (1-1-1) crystal planes. This preferential etching property of KOH based etchant is shown in FIGS. 10a and 10b. FIG. 10a shows the silicon etch rate as a function of the temperature at fixed concentration of 40%. FIG. 10b shows the silicon etch rate as a function of the concentration at fixed temperature 60° C.

Figure 5:
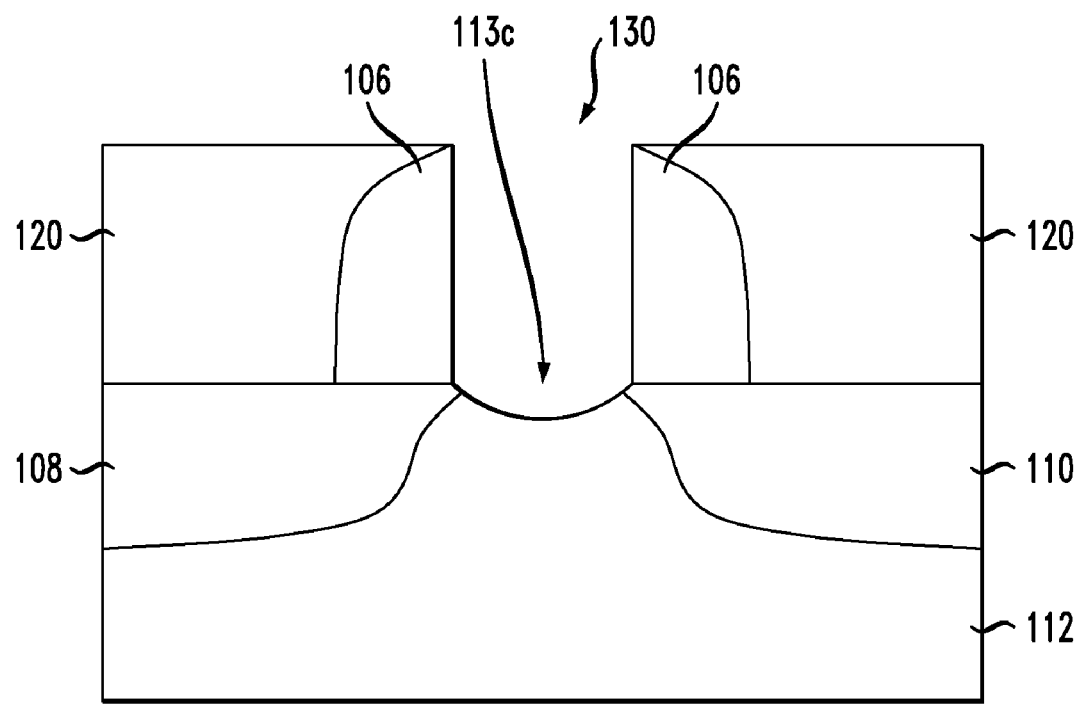

According to another implementation, the recessed surface 113 may be formed using a plasma based dry etching process having a high selectivity over nitrides and oxides. As shown in FIG. 5, such dry etching process results in a U-shaped recessed surface 113c forming the curved channel regions. Alternatively, the etching may be a well-known wet and dry combination etching process to form the U-shaped curved channel region. Wet etching is isotropic while dry etching is usually anisotropic. By combining the two etching processes the curvature and depth of the recessed surface 113c can be controlled individually.

Referring again to FIG. 4, in an implementation where the crystal orientation preferential etching process using KOH based etchant is used the formation of the V-shaped recessed surface 113 is self-limiting. Thus, the depth B of the V-shaped recess is proportional to the gate length C and not determined by the etching time. For example, relative to the FETs in logic circuits, the FETs in SRAM circuits generally have larger gate length C and thus the V-shaped recess would have greater depth B. In such SRAM circuits, the effective channel length would be even greater and realize more short channel effect reduction.

Figure 6:
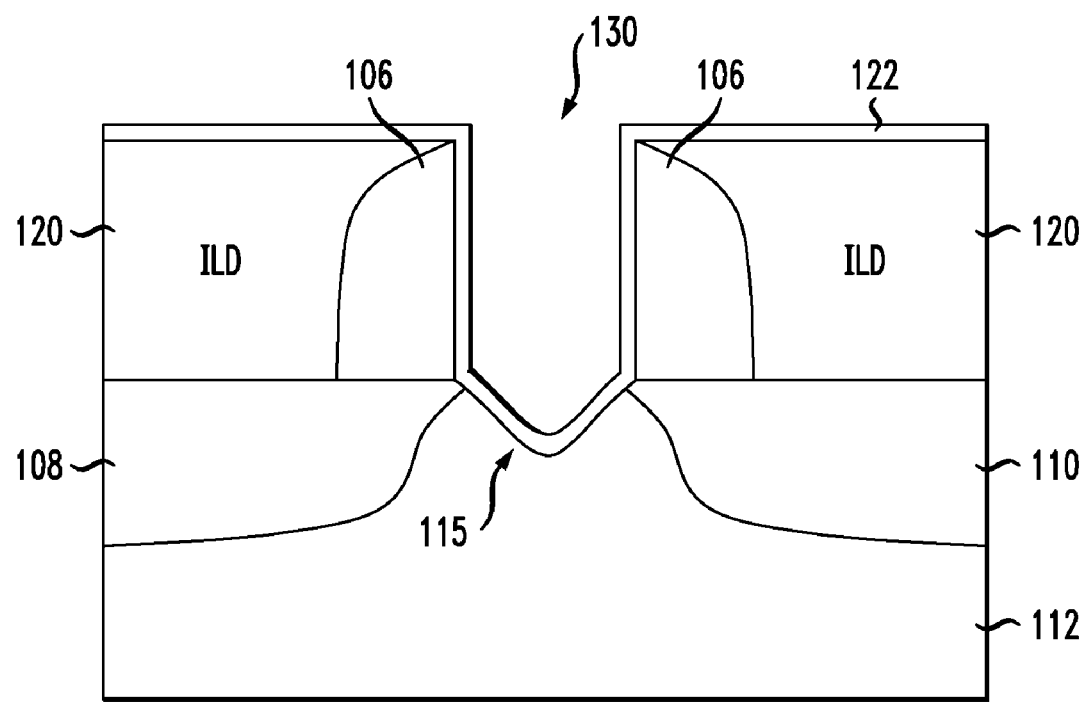

Referring to FIG. 6, after the recessed surface 113 of the channel region is formed, the transistor 100 may be completed by conventional high-κ metal gate process. For example, in one implementation, a gate dielectric layer 122 may be conformally deposited overlying the first ILD layer 120 and all surfaces within the gate trench cavity 130 including the curved channel region 115. The gate dielectric layer 122 may be formed of a high-κ dielectric material. The conformal deposition of the delectric layer 122 may cover the sidewalls and the bottom recessed surface 113 of the gate trench cavity 130. The gate dielectric layer 122 may be formed from high-κ materials that include, but not limited to, nitrogen containing dielectric, hafnium oxide, hafnium dioxide, hafnium silicon oxide, hafnium silicon oxynitride, hafnium zirconium oxide, hafnium lanthanum oxide, lanthanum oxide, zirconium oxide, zirconium silicon oxide, tantalum oxide, titanium oxide, barium strontium titanium oxide, BST, barium titanium oxide, strontium titanium oxide, yttrium oxide, aluminum oxide, lead scandium tantalum oxide, lead zinc niobate, silicon dioxide and PZT. Although a few examples of materials that may be used to form the high-κ gate dielectric layer 122 are described here, that layer may be formed using other materials that serve to reduce gate leakage.

In some implementations, the high-κ gate dielectric layer 122 may be formed on the substrate using a conventional deposition process. Such deposition process includes but is not limited to CVD, low pressure CVD, PECVD, PVD, ALD, spin-on dielectric process, or epitaxial growth. This interim structure may then be annealed at high temperature (in the range of about 600° C. to 800° C.) for a duration of about 0.5 second to 10 seconds, for a rapid thermal annealing of the high-κ gate dielectric layer 122. Such anneal may modify the molecular structure of the high-κ gate dielectric layer 122 to create an annealed gate dielectric layer for improved process control and reliability.

Figure 7:
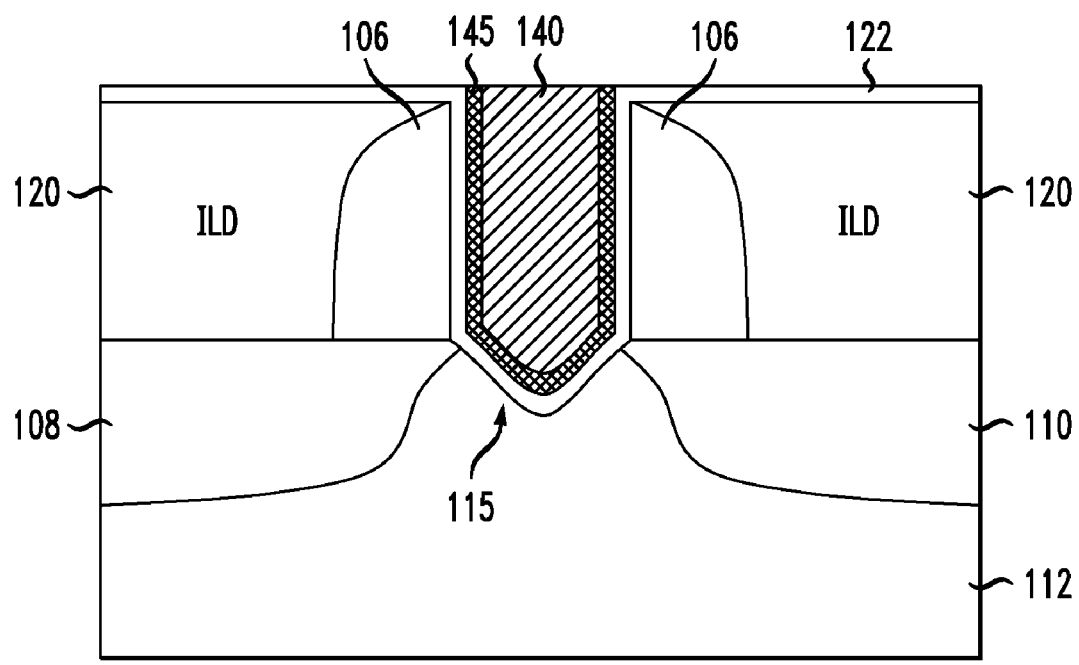

Referring to FIG. 7, next, a gate electrode metal 140 may be deposited on to the high-κ gate dielectric layer 122 in the gate trench cavity 130. The metal deposition covers the high-κ gate dielectric layer 122 and fills the gate trench cavity 130 with metal that will form the gate electrode. A well known metal deposition processes such as CVD, PVD, ALD, sputtering, electroplating, or electroless plating, may be used to deposit the metal layer. Examples of the metals that may be used include metals or metal alloys that are conventionally used for metal gate electrodes and they may include, but not limited to, one or a combination of the following metals: copper, ruthenium, palladium, platinum, cobalt, nickel, ruthenium oxide, tungsten, aluminum, titanium, tantalum, titanium nitride, tantalum carbide, tantalum nitride, hafnium, hafnium nitride, hafnium carbide, zirconium, ytterbium, a metal carbide, a metal silicide, polycide, doped polysilicon, molybdenum nitride, or a conductive metal oxide. The method of the present disclosure is applicable to FETs formed on bulk silicon semiconductor substrates as well as SOI substrates.

In another implementation, an interface layer 145 may be interposed between the gate electrode 140 and the high-κ gate dielectric layer 122. The interface layer 145 may comprise one of $Al_2O_3$, TaC, MoN, TiN, TaN, Yb, HfN or HfC. The interface layer 145 may be deposited by a process that may comprise PVD, ALD or CVD. The interface can protect high-κ layer interaction from poly-Si and other materials in the CMOS process. The interface layer 145 function as work function tuning layer or an interface layer between HK and metal gate for Vt stability adjustment after the subsequent thermal budget.

Figure 8:
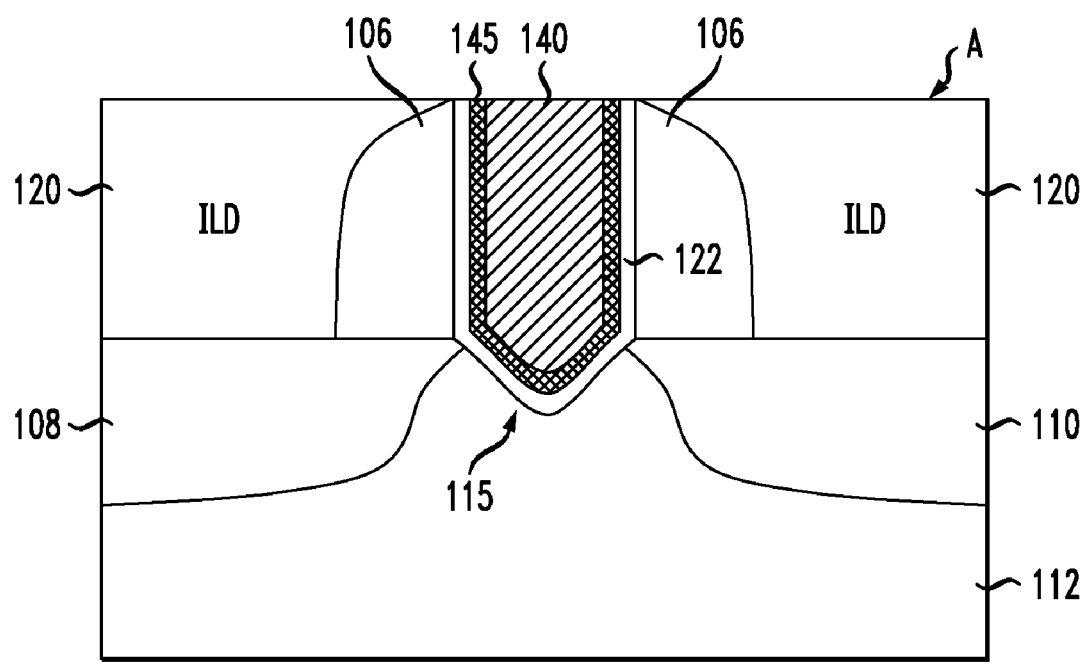

Next, referring to FIG. 8, a CMP process may be used to planarize the deposited gate electrode metal and complete the formation of the high-κ/metal gate FET 100. The CMP process removes excess portions of the gate electrode metal 140 and excess portions of the high-κ gate dielectric layer 122 leaves a planarized surface A.

Figure 11A:
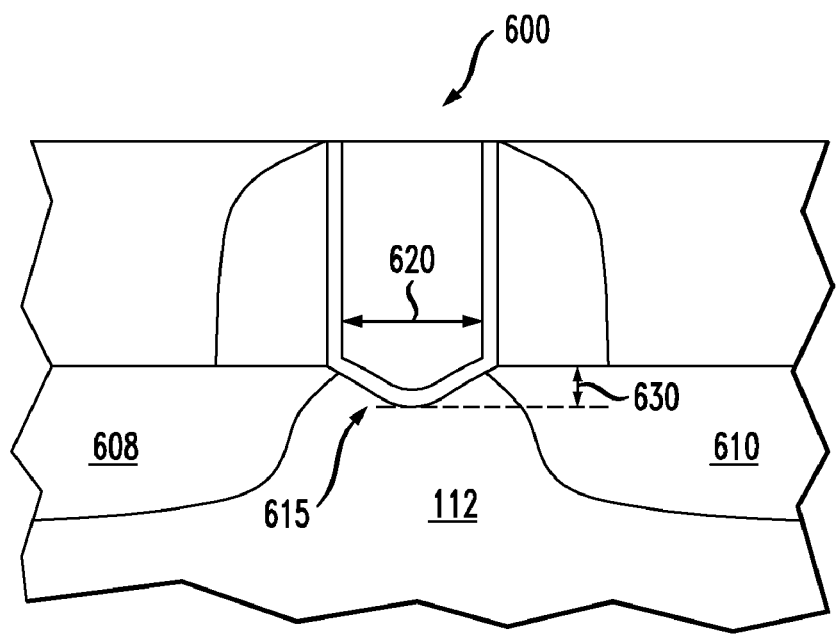
FIGS. 11a and 11b are illustrations of the field effect transistor of FIGS. 1 through 8 according to another embodiment of the present disclosure.
Figure 11B:
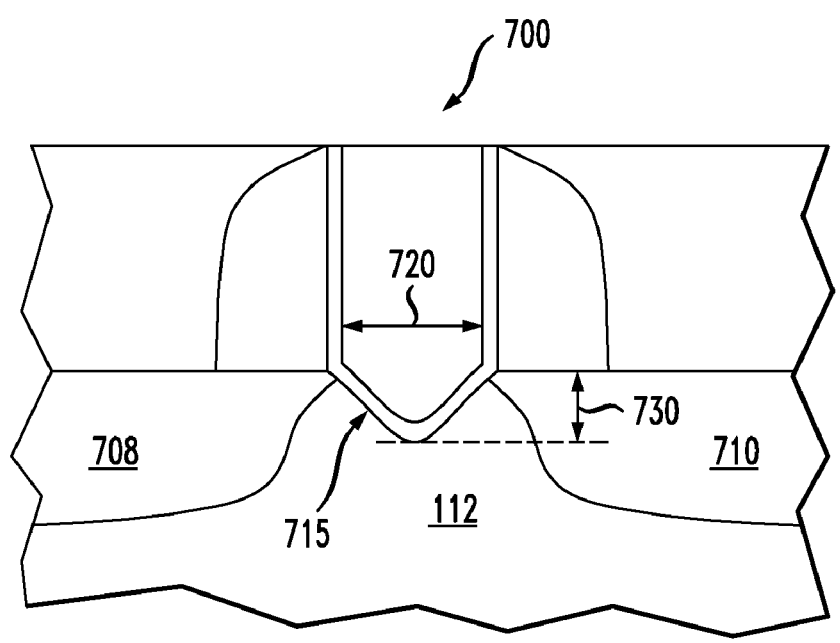
Figure 11C:
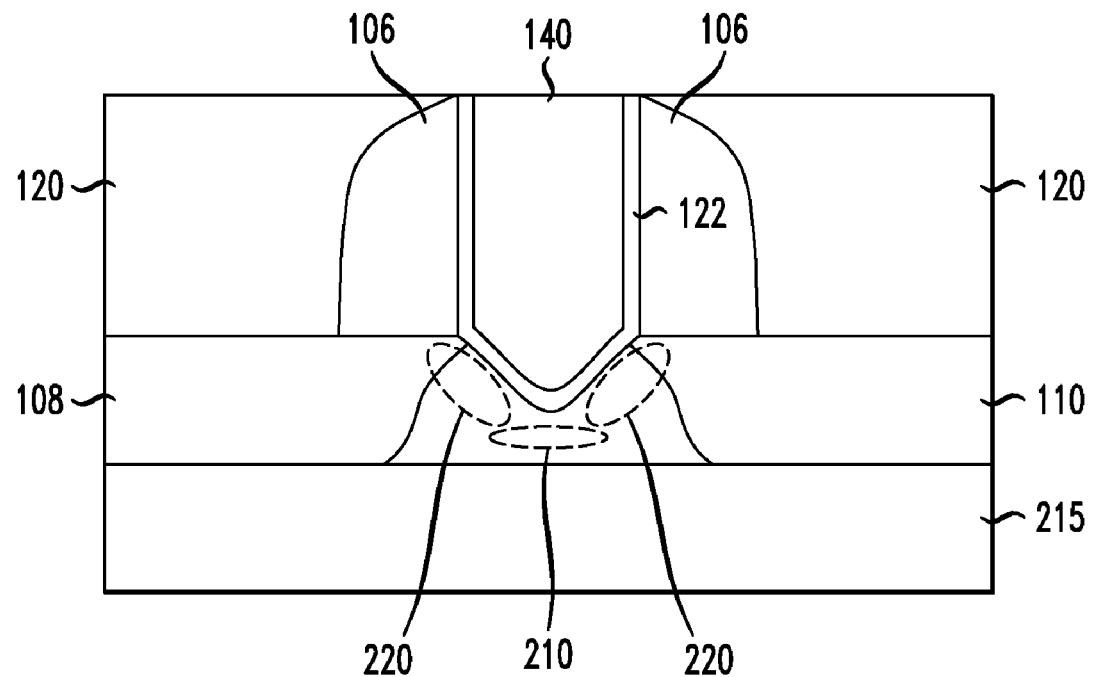
FIG. 11c is an illustration of the field effect transistor of FIGS. 1 through 8 formed on an SOI substrate.

FIGS. 11a and 11b show a comparison of a logic FET 600 to an SRAM FET 700 according to another aspect of the present disclosure. FIG. 11a shows a logic FET 600 formed on a semiconductor device substrate 112 according to the method of the present disclosure. The logic FET 600 has a curved channel region 615 between the source 608 and the drain 610 regions. As discussed earlier, the curved channel region 615 is formed by the self-limiting etching process utilizing KOH and the channel depth 630 of the logic transistor 600 is proportional to the gate length 620. The SRAM FET 700 also has a curved channel region 715 between its source 708 and the drain 710 regions. The channel depth 730 of the SRAM transistor 700 is proportional to the gate length 730. Because the gate length 730 of the SRAM transistor 700 (typically about 50 nm) is greater than the gate length 630 (typically about 35 nm) of the logic transistor 600, the channel depth 730 of the SRAM transistor 700 is greater than the channel depth 630 of the logic transistor 600. Thus, the length of the curved channel region 715 of the SRAM transistor 700 is greater than the length of the curved channel region 615 of the logic transistor 600. Thus, on a semiconductor device having both SRAM transistors and logic transistors in its active regions, the semiconductor device comprises a transistor having one recessed channel region 715 and a second transistor having a second recessed channel region 615 where the first recessed channel region 715 is longer than the second recessed channel region 615.

The method of the present disclosure is applicable to FETs formed on bulk silicon semiconductor substrates as well as SOI substrates. FIG. 11e illustrates an example of such SOI substrate 200. The SOI substrate 200 comprises, silicon semiconductor substrate 112 and a buried oxide layer 215. On the SOI substrate 200 between the source region 108 and the drain region 110 is the FET 100 having the curved channel region 113. On the SOI substrate 200, the formation of FET 100 having a curved channel region 113 results in a thinner SOI thickness D at the channel center. This allows formation of a fully depleted channel region 210 at the channel center area and allows formation of partially depleted channel regions 220 at the two sides of the channel. This further reduces short channel effect by minimizing the drain induced interface lowering. Floating body effect is also reduced because of lower reverse diode leakage.

While the invention has been particularly shown and described with reference to the preferred embodiments thereof, it will be understood by those skilled in the art that various changes in form and details may be made without departing from the spirit and scope of the invention. Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A metal oxide semiconductor field effect transistor device comprising:
   a semiconductor substrate;
   a source region and a drain region formed in the semiconductor substrate;
   a recessed channel region in the semiconductor substrate between the source region and the drain region, the recessed channel region formed by a pair of inclined surfaces in the semiconductor substrate wherein the inclined surfaces are oriented substantially along <111> crystal directions;
   a high-κ gate dielectric layer overlying the recessed channel region;
   a metal gate electrode overlying the gate dielectric layer; and
   a pair of spacers disposed on two sides of the gate electrode, wherein the high-κ gate dielectric layer conformally lines the interface between the spacers and the gate electrode.

2. The device of claim 1, wherein the recessed channel region has a substantially V-shaped profile.

3. The device of claim 1, wherein the semiconductor substrate is a silicon substrate.

4. The device of claim 1, wherein the semiconductor substrate is a silicon on insulator substrate.

5. The device of claim 1, further comprising an interface layer interposed between the gate electrode and the high-κ gate dielectric layer.

6. The device of claim 5, wherein the interface layer comprises one of $Al_2O_3$, TaC, MoN, TiN, TaN, Yb, HfN, or HfC.

7. A metal oxide semiconductor field effect transistor device comprising:
   a semiconductor substrate;
   a source region and a drain region formed in the semiconductor substrate;
   a pair of spacers formed over the semiconductor substrate and defining a gate trench therebetween, the spacers forming sidewalls of the gate trench;
   a recessed channel region formed at the bottom of the gate trench between the source region and the drain region, the recessed channel region formed by a pair of inclined surfaces oriented substantially along <111> crystal directions;

a high-κ gate dielectric layer conformally lining the sidewalls of the gate trench and overlying the recessed channel region; and a metal gate electrode overlying the gate dielectric layer.

8. The device of claim 7, wherein the recessed channel region has a substantially V-shaped profile.

9. The device of claim 7, wherein the semiconductor substrate is a silicon substrate.

10. The device of claim 7, wherein the semiconductor substrate is a silicon on insulator substrate.

11. The device of claim 7, further comprising an interface layer interposed between the gate electrode and the high-κ gate dielectric layer.

12. The device of claim 11, wherein the interface layer comprises one of $Al_2O_3$, TaC, MoN, TiN, TaN, Yb, HfN or HfC.

13. A metal oxide semiconductor field effect transistor device comprising:

a semiconductor substrate;

a source region and a drain region formed in the semiconductor substrate;

a recessed channel region formed by a pair of inclined surfaces oriented substantially along <111> crystal directions;

a high-κ gate dielectric layer overlying the recessed channel region;

a metal gate electrode overlying the gate dielectric layer; and a pair of spacers disposed on two sides of the gate electrode, wherein the high-κ gate dielectric layer conformally lines the interface between the spacers and the gate electrode.

14. The device of claim 13, wherein the recessed channel region has a substantially V-shaped profile.

15. The device of claim 13, wherein the semiconductor substrate is a silicon substrate.

16. The device of claim 13, wherein the semiconductor substrate is a silicon on insulator substrate.

17. The device of claim 13, further comprising an interface layer interposed between the gate electrode and the high-κ gate dielectric layer.

18. The device of claim 17, wherein the interface layer comprises one of $Al_2O_3$, TaC, MoN, TiN, TaN, Yb, HfN or HfC.

* * * * *